United States Patent
Kropp et al.

(10) Patent No.: US 9,047,957 B2
(45) Date of Patent: Jun. 2, 2015

(54) PROGRAMMABLE READ-ONLY MEMORY DEVICE AND METHOD OF WRITING THE SAME

(75) Inventors: Holger Kropp, Wedemark (DE); Meinolf Blawat, Hannover (DE)

(73) Assignee: Thomson Licensing, Issy-les-Moulineaux (FR)

( * ) Notice: Subject to any disclaimer, the term of this patent is extended or adjusted under 35 U.S.C. 154(b) by 203 days.

(21) Appl. No.: 13/557,179

(22) Filed: Jul. 24, 2012

(65) Prior Publication Data

US 2013/0039116 A1 Feb. 14, 2013

(30) Foreign Application Priority Data

Aug. 9, 2011 (EP) .................................. 11306023

(51) Int. Cl.
```
G11C 17/00      (2006.01)
H01L 29/06      (2006.01)
H01L 31/00      (2006.01)
G11C 17/10      (2006.01)
B82Y 10/00      (2011.01)
G11C 13/02      (2006.01)
G11C 23/00      (2006.01)
H01L 27/10      (2006.01)
H01L 27/102     (2006.01)
B82Y 30/00      (2011.01)
```

(52) U.S. Cl.
CPC ................. *G11C 17/10* (2013.01); *B82Y 10/00* (2013.01); *G11C 13/025* (2013.01); *G11C 23/00* (2013.01); *H01L 27/101* (2013.01); *H01L 27/1021* (2013.01); *H01L 29/0665* (2013.01); *G11C 2213/16* (2013.01); *G11C 2213/19* (2013.01); *G11C 2213/35* (2013.01); *G11C 2213/81* (2013.01); *B82Y 30/00* (2013.01)

(58) Field of Classification Search
CPC ............. G11C 13/025; G11C 13/0014; G11C 2213/16; G11C 2213/17; G11C 2213/19; G11C 2213/35; H01L 51/0048; H01L 23/53276; H01L 21/02606; H01L 29/0669; H01L 51/444; Y10S 977/742; Y10S 977/724
USPC ................. 365/94; 257/14, E29.327; 977/742
See application file for complete search history.

(56) References Cited

U.S. PATENT DOCUMENTS 6,325,909 B1 * 12/2001 Li et al. ......................... 205/106
6,423,583 B1    7/2002 Avouris et al.

(Continued)

FOREIGN PATENT DOCUMENTS

JP           200628818       8/2006
WO         WO2006115486      11/2006

OTHER PUBLICATIONS

European Search Report dated Dec. 27, 2011.

(Continued)

*Primary Examiner* — J. H. Hur
*Assistant Examiner* — Ajay Ojha
(74) *Attorney, Agent, or Firm* — International IP Law Group, PLLC

(57) ABSTRACT

A bit cell of the PROM-device comprises a carbon nanotube having a tilted portion comprising a free end and a fixed portion which is to the reference node. The carbon nanotube comprises a structural defect between the fixed and the tilted portion which causes the carbon nanotube to tilt such that the free end is electrically connected to either the storage electrode or an opposite release electrode.

14 Claims, 4 Drawing Sheets

(56) References Cited

U.S. PATENT DOCUMENTS

| | | |
|---|---|---|
| 6,706,566 B2 | 3/2004 | Avouris et al. |
| 7,112,493 B2 | 9/2006 | Bertin et al. |
| 7,280,394 B2 | 10/2007 | Bertin et al. |
| 7,329,931 B2 | 2/2008 | Bertin |
| 7,348,591 B2 | 3/2008 | Yamauchi et al. |
| 7,378,715 B2 | 5/2008 | Lee |
| 7,668,004 B2 | 2/2010 | Furukawa et al. |
| 7,675,768 B1 | 3/2010 | Kim |
| 7,719,067 B2 | 5/2010 | Jaiprakash et al. |
| 2004/0004212 A1* | 1/2004 | Crespi et al. .............. 257/14 |
| 2005/0041466 A1* | 2/2005 | Rueckes et al. ............ 365/177 |
| 2005/0280436 A1 | 12/2005 | Bertin |
| 2008/0012047 A1 | 1/2008 | Bertin et al. |
| 2008/0137397 A1* | 6/2008 | Furukawa et al. ............ 365/151 |
| 2010/0065817 A1 | 3/2010 | Lee |
| 2010/0149895 A1 | 6/2010 | Kim |
| 2011/0104831 A1* | 5/2011 | Hyde et al. .................. 438/17 |

OTHER PUBLICATIONS

Chico etal; "Pure Carbon Nanoscale Devices: Nanolube Heterojunctions", Physical Reveiw Letters, vol. 76, No. 6, pp. 971-974, Feb. 5, 1996.

http://en.wikipedia.org/wiki/prograrnrnable/read-only_memory, Aug. 11, 2010.

Leonard, "The Physics of Carbon Nanolube Devices", Elsevier Science, Aug. 2008, pp. 166-171.

* cited by examiner

PROGRAMMABLE READ-ONLY MEMORY DEVICE AND METHOD OF WRITING THE SAME

This application claims the benefit, under 35 U.S.C. § 119 of EP Patent Application 11306023.0, filed 09 Aug. 2011.

FIELD OF THE INVENTION

The invention relates to a programmable read-only memory (PROM) device and a method of operating such a PROM-device.

BACKGROUND

A programmable read-only memory (PROM) is a non-volatile data storage, wherein programming of data may be performed after the device has been manufactured. Typically, PROMs are manufactured blank and depending on the technology, the PROM-device is programmed at wafer level, at a final testing stage or in system. Classical PROM-devices log each bit in a memory cell comprising a fuse or an anti-fuse. Typically, the default setting of each memory cell is a logical value identical to "0". By blowing the fuse or anti-fuse irreversibly, this value may be set to "1". Blowing a fuse opens a connection while programming an anti-fuse closes the connection. Because it is impossible to "un-blow" the fuse, data is stored permanently.

A different approach to a PROM-device is a carbon nanotube based memory cell, as exemplarily disclosed by Furukawa in U.S. Pat. No. 7,668,004. This document teaches a memory cell 2 as shown in the simplified circuit diagram of FIG. 1. The memory cell 2 comprises a MOS transistor 4 that is coupled to a word line WL and to a bit line BL. Further, a sense amplifier 6 is coupled to the bit line BL and to a reference voltage VREF. The channel of the MOS transistor 4 is coupled to a carbon nanotube element 8 comprising a storage electrode that is coupled to a storage node 10 and to a release electrode that is coupled to a release node 14 that is further coupled to a release line RL. A carbon nanotube 16 is coupled to a reference node 12.

Within the context of this specification a carbon nanotube 16 will be referred to as a nanotube only. Preferably, single walled carbon nanotubes having the typical cylindrical nanostructure which is made from a honeycomb crystal lattice of graphene which is a hexagonal carbon structure are applied.

The nanotube 16 has two possible states which are illustrated in FIG. 2a and FIG. 2b. In principle, the nanotube element 8 is a switch, wherein by way of an example only, the status in FIG. 2a corresponds to an ON-state representing a logical "1" and the status in FIG. 2b represents the OFF-state and corresponds to a logical "0". There is a small capacitance between the nanotube 16 and the storage terminal 18 and the release terminal 20, respectively. By applying a suitable voltage between either the storage node 10 and the reference node 12 or the release node 14 and the reference node 12, a respective switching state may be realized. Due to attractive Van-der-Waals forces between the nanotube 16 and the respective terminal 18, 20, the nanotube 16 is bound to either one of the electrodes 18, 20 and is held in its respective switching state.

In a memory cell 2 of a PROM-device, the connection or disconnection between the word line WL and the bit line BL is set permanently. FIG. 3 is a simplified detailed view to a couple of memory cells 21 ... 26 of a PROM-device 6. The memory cells 21 ... 26 are coupled between the respective bit lines BL1 ... BL3 and word lines WL1 and WL2. Each bit line BL1 ... BL3 comprises a protective resistor 30. Further, each memory cell 21 ... 26 comprises a switch 32, e.g. a fuse or anti-fuse element or a nanotube element 8 as exemplarily shown in FIGS. 1 and 2. For reading out a memory cell 21 ... 26, a high level is applied to the selected word line, e.g. WL1. Now, access is provided to all memory cells 21 ... 23 that are coupled to this word line WL1. After this addressing step, a conductive memory cell, e.g. memory cell 22 provides a high level to the assigned bit line, i.e. BL2. In order to protect the other memory cells, i.e. memory cells 21 and 23 from the high level of word line WL1, every memory cell 21 ... 26 comprises a diode 34.

However, the data retention times of PROM-devices using a carbon nanotube based switch 32 is not sufficient, especially for data archives. Further, the PROM-device comprises a high number of different elements, e.g. switches 32, diodes 34 and resistors 30. This leads to a complex production process.

It is an object of the present invention to provide an improved PROM-device and an improved method of operating a PROM-device.

SUMMARY

According to an aspect of the invention, a programmable read only memory (PROM) device is provided. The PROM-device comprises a storage electrode that is coupled to a word line and a reference electrode that is coupled to a bit line. Further, a memory cell of the PROM-device comprises a nanotube having a tilted portion comprising a free end and a fixed portion which is coupled to the reference node which preferably serves as a bottom electrode for the nanotube. The nanotube comprises a structural defect between the fixed portion and the tilted portion. This structural defect causes the nanotube to bend or tilt towards either the storage electrode or an opposite release electrode. The nanotube is bending such that its free end is electrically connected to either the storage electrode or the release electrode.

The nanotube is bent or tilted due to its structural defect. The configuration of the nanotube is however stable because a reconstruction of the nanotube will take place after generation of the structural defect.

This reconstruction may take place by integration of one or more heptagons and/or pentagons in the carbon nanotube structure which is typically a honeycomb like hexagonal structure. Preferably, the nanotube may be bent by integrating at least one heptagon-pentagon pair.

Programming of the storage cell may be performed by a controlled generation of structural defects in the nanotube. On the one hand, this is a very efficient way of programming the storage cell, on the other hand, the reconstructed structure of the nanotube is stable for long periods of time. Advantageously, this leads to long term data stability. Further, the storage cell needs a small area only. Accordingly, a high storage density may be achieved. In summary, a PROM-device according to aspects of the invention offers high data stability and high storage density, which makes it suitable for data archive systems that have to store large amounts of data for a long period of time.

According to another aspect of the invention, the tilted portion and the fixed portion are configured to have a different electronic band-gap. Preferably, these two portions of the nanotube have band-gaps so as to form a diode between the tilted portion and the fixed portion.

The electronic properties of nanotubes depend on their microstructure and may be widely varying. For instance, the structure of a single walled nanotube may be characterized by a pair of indices (n, m), the chiral vector. The integers n and m denote the number of unit vectors along two directions in the honeycomb crystal lattice. While nanotubes having a chiral vector with indices n=m are typically metallic, the nanotube will be a semiconductor if (n−m) mod 3=0 which means that the difference n−m is a multiple of 3. Further, the width of the electronic band-gap of the nanotube may be a function of its diameter. The band-gaps of the tilted portion and the fixed portion of the nanotube may be adjusted by selecting a suitable chiral vector (n, m) or diameter for the respective portions of the nanotube.

Advantageously, the diode, which is typically a separate element of storage cells which are known in the prior art, may be integrated in the nanotube element. The separate diode is dispensable since it may be realized by the nanotube itself. This reduction of elements simplifies the production process. By way of an example only, the band gap of one part of the nanotube is comparable to a band gap of a semiconductor and the band gap of the other portion is comparable to a band gap of a metal. This will result in a Schottky-diode. Advantageously, a diode that is a part of every single memory-cell of the PROM-device may be provided.

According to an embodiment of the invention, a second nanotube is coupled to the storage electrode and the first free end of the first nanotube is electrically connected to the storage electrode via the second nanotube. Preferably, the first end of the first nanotube faces a second free end of the second nanotube. According to another aspect of the invention, the tilted portion of the first nanotube has a different band-gap than the second nanotube. In an aspect of the invention, the first and second nanotube may have different diameters or different chiral vectors which lead to different electronic band-gaps.

According to this aspect of the invention, an electrical connection between the first and second carbon nanotube results in a diode, too. Advantageously, there will be another diode that is a part of every single memory-cell of the PROM-device. This may be advantageous if the diode should—for whatsoever reason—not be realized by the bent nanotube itself.

According to another embodiment of the invention, the storage electrode and/or the release electrode comprise a surface oxide layer. Preferably, this oxide layer has a predetermined ohmic resistance. The oxide layer may be located at a surface of the electrodes that is facing the free end of the nanotube. Advantageously, this oxide layer replaces the protective resistor that is typically a part of every bit-line of a PROM-device.

In another embodiment of the invention, the anode of this nanotube based diode is coupled to the word line and the cathode thereof is coupled to the bit line. This orientation of the diode, however, depends on the design of the PROM-device and the polarity of the bit- and word-line. If polarity should be altered, the diode has to be designed such that its orientation is the other way round.

In another aspect of the invention, a method of operating a programmable read-only memory (PROM) device is provided. The PROM-device has a storage electrode that is coupled to a word line and reference node that is coupled to a bit line. A memory cell of the PROM-device comprises a nanotube having a tilted portion comprising a free end and a fixed portion which is coupled to the reference node. Preferably, this reference node serves as a bottom electrode for the nanotube. For writing bit information to the memory cell, a structural defect is induced in the nanotube. This structural defect is induced such that the free end of the nanotube is tilted towards either the storage or the release electrode. An electrical connection to either the storage or the release electrode may be established.

Preferably, the step of inducing the structural defect comprises an implantation of an impurity in the carbon nanotube. This induction of the structural defect may be performed by ion implantation of foreign or impurity atoms, e.g. metal atoms. Preferably, this implantation step is performed during the semiconductor manufacturing process.

A structural defect in the nanotube will probably cause free electron orbitals at the nanotube's carbon atoms that are adjacent to the defect in the hexagonal structure. A mechanic bending process will help the orbitals to overlap again. However, this will result in a shortening of the nanotube at one of its sides. Reorganization may take place wherein heptagonal and/or pentagonal structures may be integrated into the nanotube structure. This may be supported by performing a curing or annealing step.

Same or similar advantages that have been already mentioned with respect to the PROM-device also apply to the method of writing the PROM-device.

BRIEF DESCRIPTION OF DRAWINGS

Further aspects of the invention will ensue from the following description of example embodiments with reference to the accompanying drawings, wherein.

DETAILED DESCRIPTION OF EXAMPLE EMBODIMENTS

Figure 1:
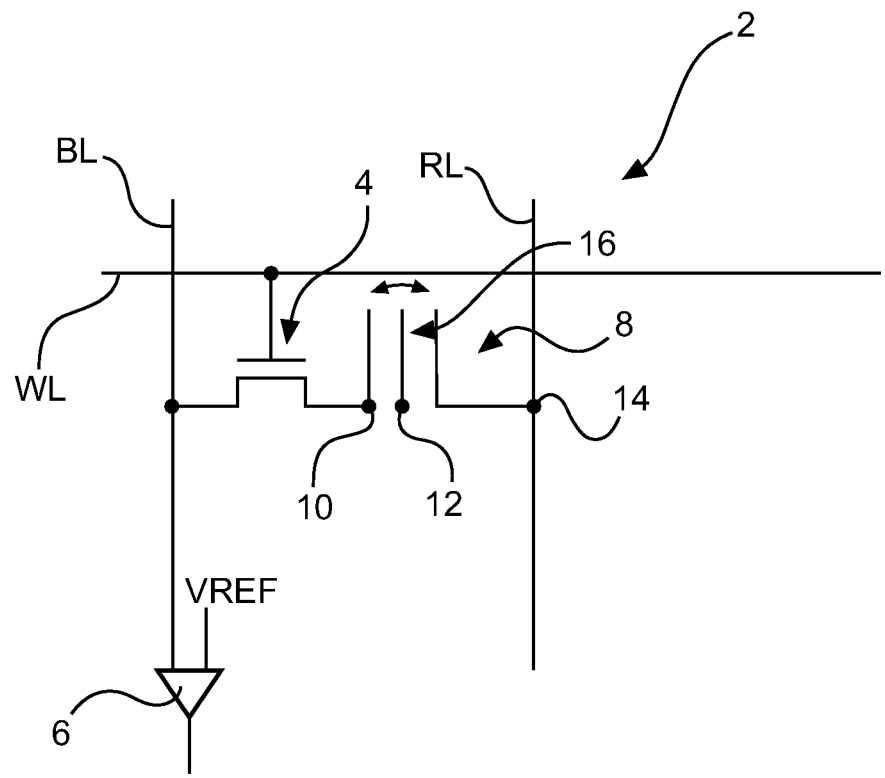
FIG. 1 is a simplified circuit diagram of a memory cell.
Figure 2:
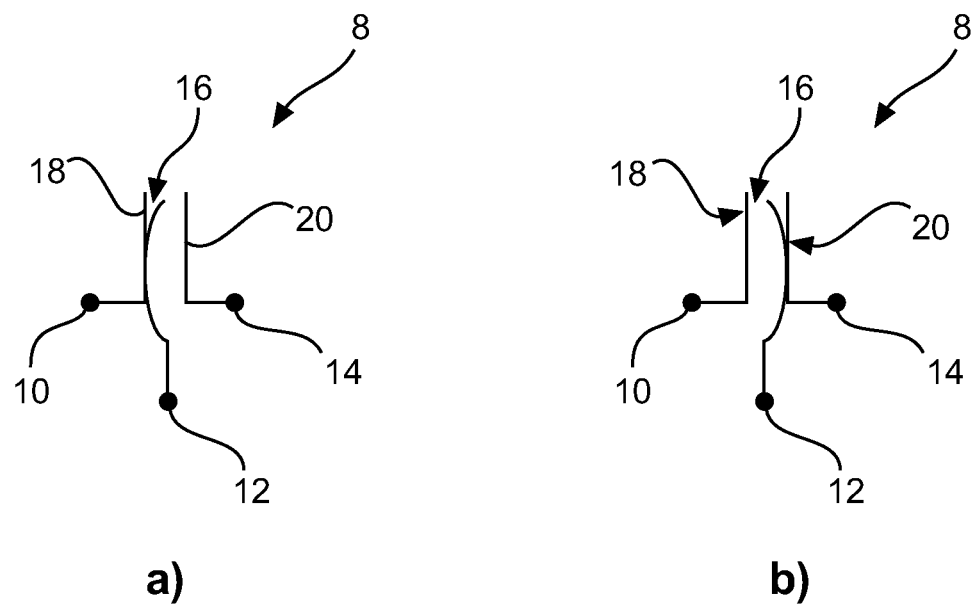
FIGS. 2a and 2b are simplified detailed views to a nanotube element of a memory cell and FIG. 3 is a simplified circuit diagram of a PROM-device, according to the prior art.
Figure 3:
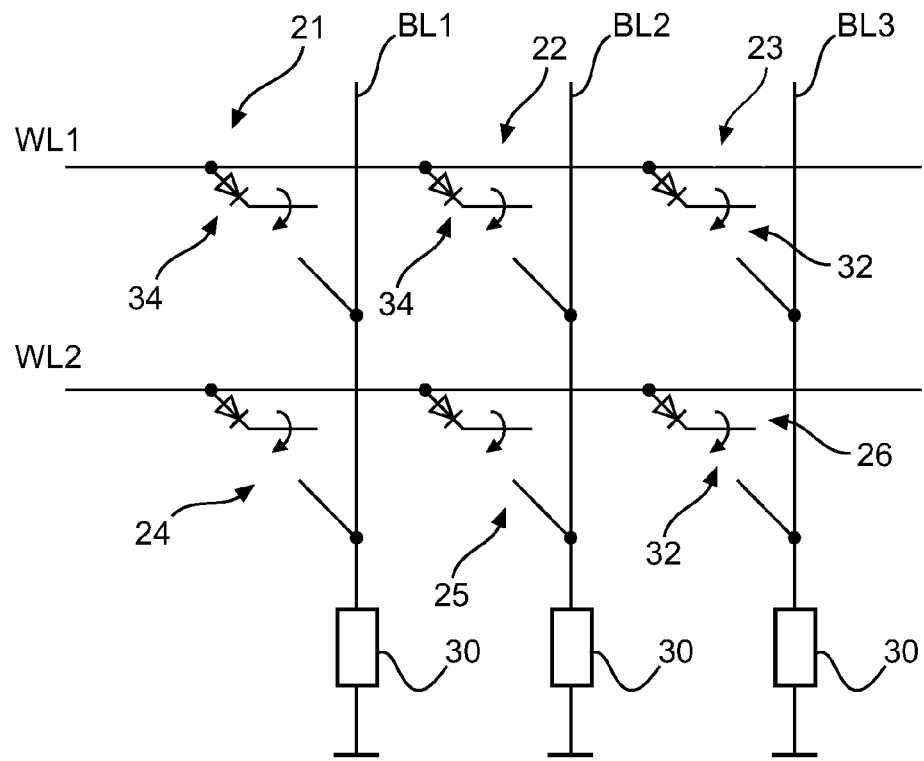
Figure 4:
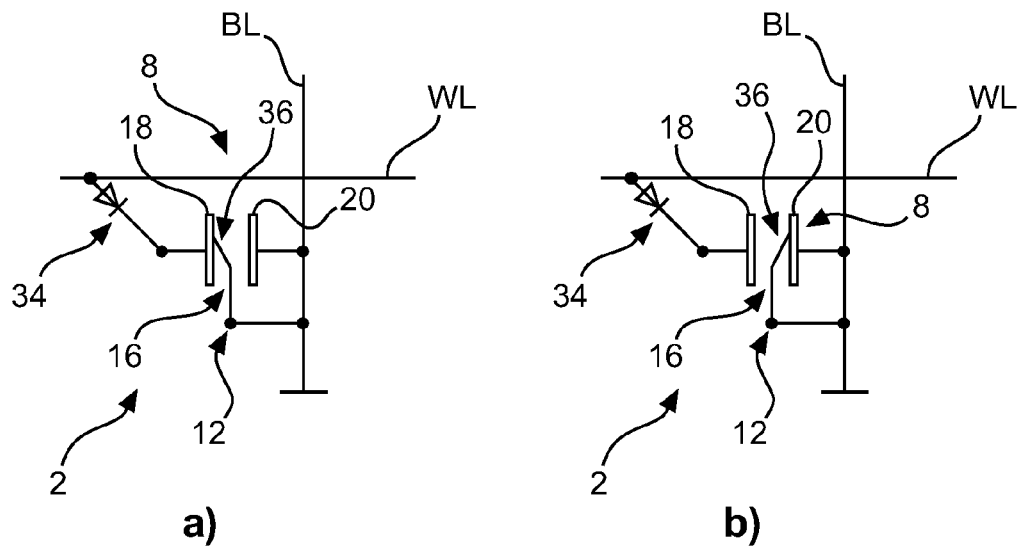
FIGS. 4a and 4b are simplified circuit diagrams of memory cells of a PROM-device, according to an embodiment of the invention.

FIGS. 4a and 4b show simplified circuit diagrams of a memory cell 2 for a PROM-device according to an embodiment of the invention. FIG. 4a shows the ON-status, corresponding to a logical "1". A bit line BL and a word line WL are coupled to the memory cell 2. The memory cell 2 comprises a nanotube element 8 having a storage electrode 18 and a release electrode 20 which are coupled to the word line WL and the bit line BL, respectively. A diode 34 is coupled between the word line WL and the storage electrode 18 in forward direction, which means that the anode of the diode 34 is coupled to the word line WL and the cathode is coupled to the storage electrode 18. A carbon nanotube 16, in the context of this specification referred to as a nanotube only, is coupled to the reference node 12, serving as a base electrode, and further to the bit line BL. The nanotube 16 comprises a structural defect which causes a free end 36 of the nanotube 16 to bend or tilt towards the storage electrode 18. An electrical contact is provided between the word line WL and the bit line BL via the nanotube 16. The nanotube 16 is in a stable configuration and provides an electrical connection having a high long-term stability.

The simplified circuit diagram in FIG. 4b represents a logical "0". The memory cell 2 is in the OFF-status. The configuration of the memory cell 2 is comparable to the configuration in FIG. 4a despite of the fact that the free end 36 of the nanotube 16 is tilted towards the release electrode 20. This is due to a different structural defect. Accordingly, the nanotube 16 provides an electrical connection between the release electrode 20 and the reference node 12 that are both coupled to the bit line BL.

Figure 5:
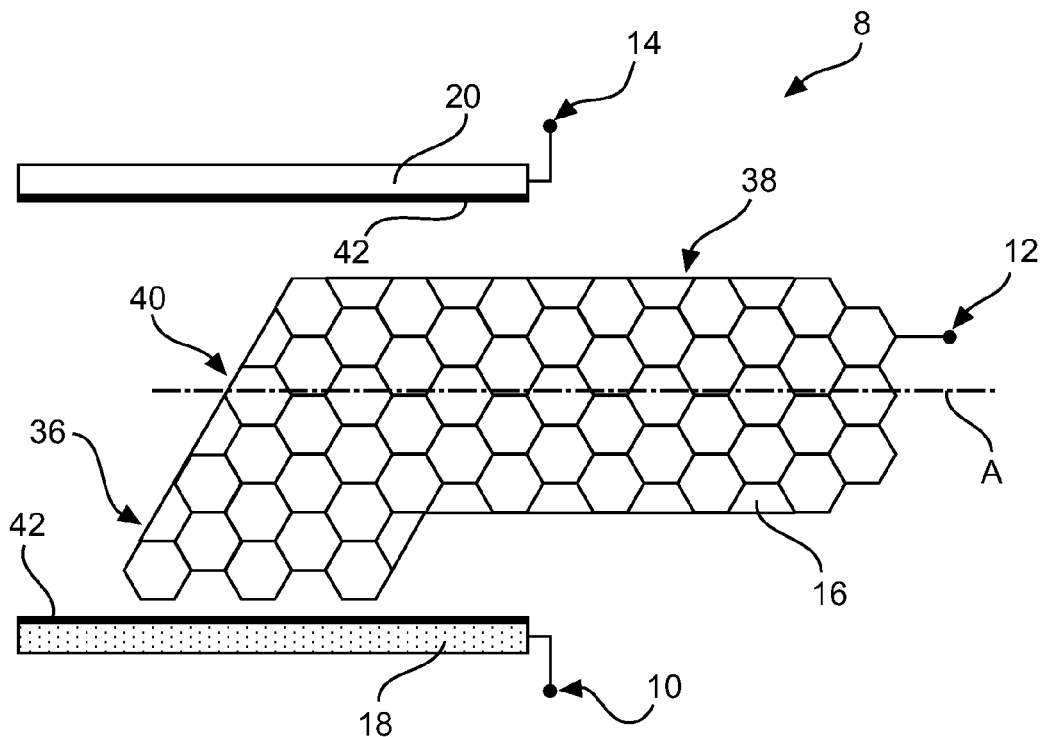
FIGS. 5 to 7 are simplified detailed views to a nanotube element, according to embodiments of the invention

FIG. 5 is a simplified detailed view to the nanotube element 8 of FIG. 4a. The nanotube 16 comprises a fixed portion 38 and a tilted portion 40. The hexagonal honeycomb structure of the nanotube is indicated by the honeycomb pattern in FIG. 5. However, the hexagonal honeycombs are used as a filling pattern only. The depicted hexagonal structure does not correspond to the microstructure of the nanotube 16; the same applies to FIGS. 6 and 7. The nanotube 16 comprises a structural defect which is located between the fixed portion 38 and the tilted portion 40. The structural defect is not shown in FIGS. 5 to 7. This structural defect comprises e.g. one or more heptagons and/or pentagons which are integrated into the typically honeycomb like hexagonal structure of the nanotube. Preferably, the nanotube 16 comprises at least one heptagon-pentagon pair. The nanostructure of a tilted nanotube is e.g. known in detail from Phys. Rew. Lett., p. 971, 1996. This structural defect causes the nanotube to bend with respect to the longitudinal access A towards the storage electrode 18. There is an electrical contact between the free end 36 of the nanotube 16 and the storage electrode 18 that is further coupled to the storage node 10.

The structural defect may be generated by ion implantation of foreign atoms, e.g. metal atoms. The high kinetic energy causes a structural defect in the hexagonal carbon structure. Accordingly, vacancies and free bindings may be generated and the free end 36 of the nanotube 16 will tilt due to attractive forces between the free orbitals of the carbon atoms. Defects in the nanotube 16 structure may be cured in an annealing step.

The tilted portion 40 and the fixed portion 38 of the nanotube 16 may be configured to have different electronic band-gaps. The tilted portion 40 and the fixed portion 38 of the nanotube 16 have band-gaps so as to form a diode between each other. The electronic properties of nanotube 16 depends on the microstructure and may be widely varying. The electronic band-gap may be a function of the chiral vector (n, m). While nanotubes having a chiral vector with indices n=m are typically metallic, the nanotube 16 will be a semiconductor if (n−m) mod 3=0. Further, the width of the electronic band-gap of the nanotube 16 may be a function of its diameter. Advantageously, the diode, which is typically a separate element of storage cells which are known in the prior art, may be integrated in the nanotube element 8.

Further, the storage electrode 18 and the release electrode 20 may comprise an oxide layer 42. In other words, a surface that is facing the free end 36 of the nanotube 16 may be covered with the oxide layer 42. The oxide layer 42 may have a predetermined ohmic resistance and provides a resistor between the storage electrode 18 and the free end 36 of the nanotube 16 and the release electrode 20, respectively. Advantageously, a protective resistor may be integrated in the nanotube element 8.

Figure 6:
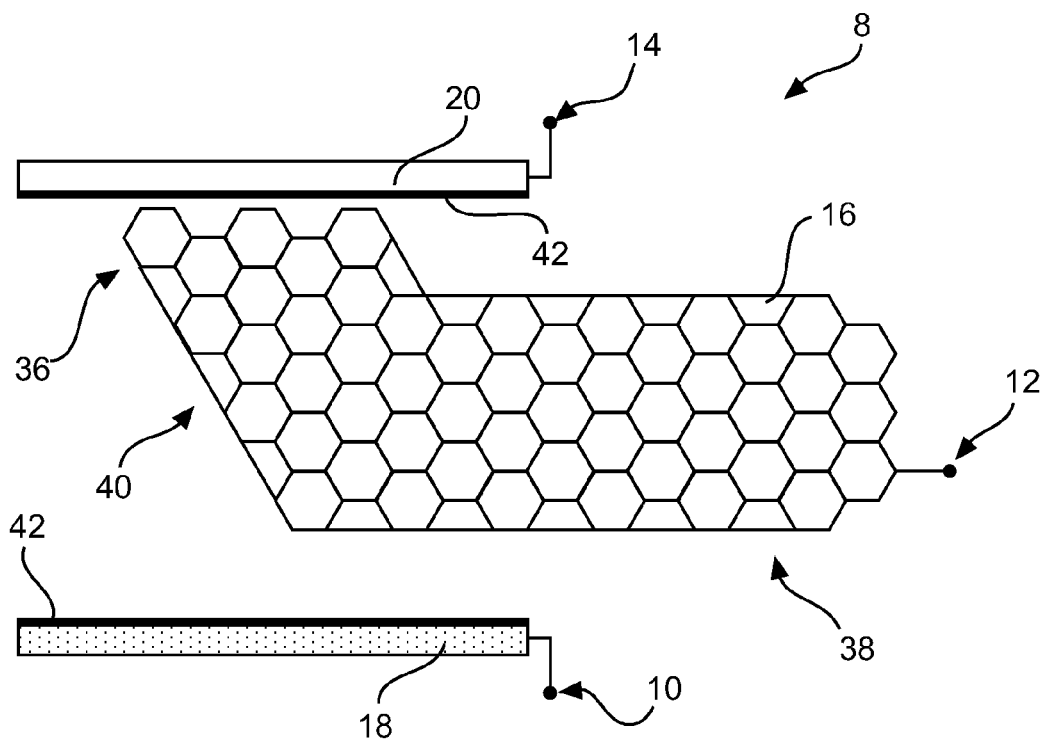

FIG. 6 is a further detailed view of a nanotube element 8 comprising a nanotube 16 having a free end 36 that is tilted towards the release electrode 20. This figure corresponds to the situation in FIG. 4b. There is an electrical connection between the release electrode 20 and the free end 36. The nanotube element 8 is in the OFF-status, representing a logical "0". In comparison to the situation in FIG. 5, the structural defect may be arranged vice versa.

Figure 7:
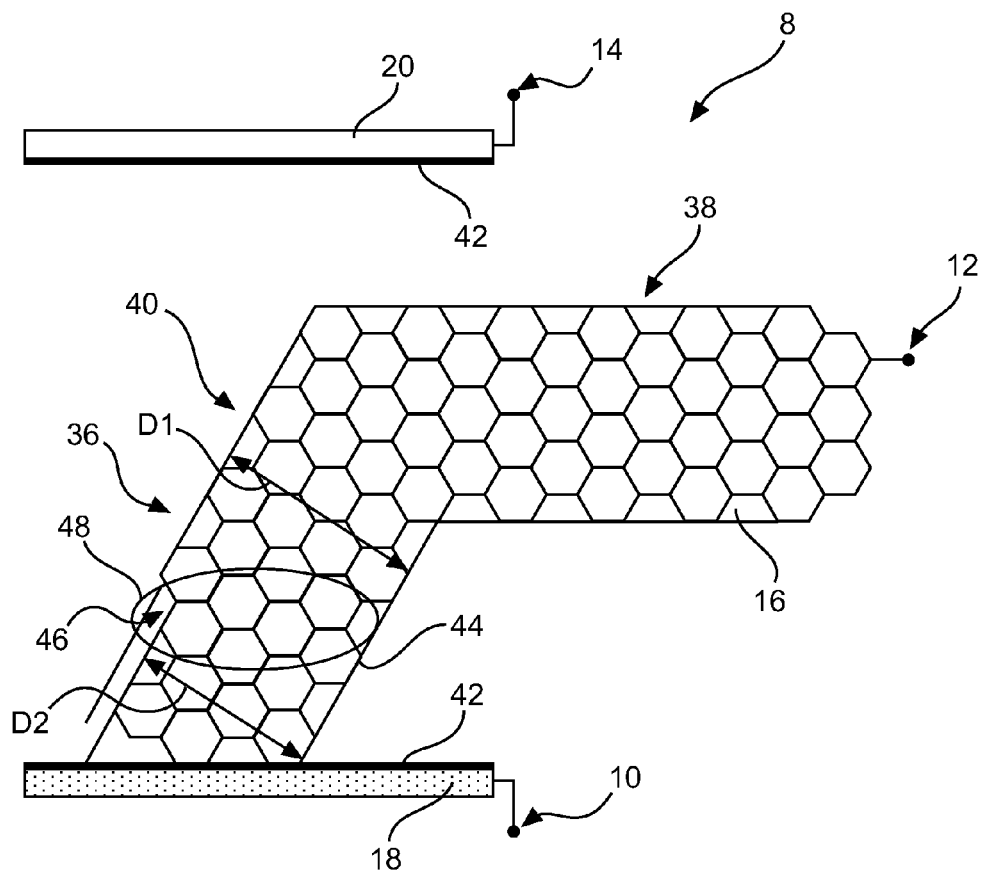

FIG. 7 is a further detailed view to a nanotube element 8 of a memory cell 2 that is a part of PROM-device according to another embodiment of the invention. Due to the arrangement of the structural defect, the free end 36 of the nanotube 16 is tilted towards the storage electrode 18. This configuration represents the ON-status of the nanotube element 8. The storage electrode 18 comprises a second nanotube 44. This second nanotube 44 comprises a second free end 46 that is adjacent to the free end 36 of the first nanotube 16. The first and the second nanotube 16, 44 are in electrical contact via their free ends 36, 46. The first nanotube 16 and the second nanotube may have a different electronic band-gap. This may be due to their different chiral vector (n, m). However, the electronic band-gap may be a function of the diameter of the nanotube 16, 44, too. By way of an example only, the first nanotube 16 has a first diameter D1 that is greater than a second diameter D2 of the second nanotube 44. Both, the first and the second diameter D1, D2 are measured in a zone of the first and second nanotube 16, 44, respectively, that comprises the respective free end 36, 46 of the respective nanotube 16, 44. Due to the fact, the first and second nanotube 16, 44 have a different electronic band gap, a semiconductor- or heterojunction may be provided in the transitional area 48 between the free ends 36, 46 of the first and second nanotube 16, 44. This junction can result in diode characteristic of the contact between the nanotubes 16, 44. In the configuration of FIG. 7, the diode is arranged in forward direction between the storage electrode 18 and the carbon nanotube 16. Advantageously, the diode is integrated into the nanotube element 8 and is a part of each memory cell 2 of a PROM-device.

The storage electrode 18 further comprises a surface oxide layer 42 and the second nanotube 44 is coupled to the storage electrode 18 via this surface oxide layer 42. Accordingly, a resistor may be provided between the storage electrode 18 and the second carbon nanotube 44.

Figure 8:
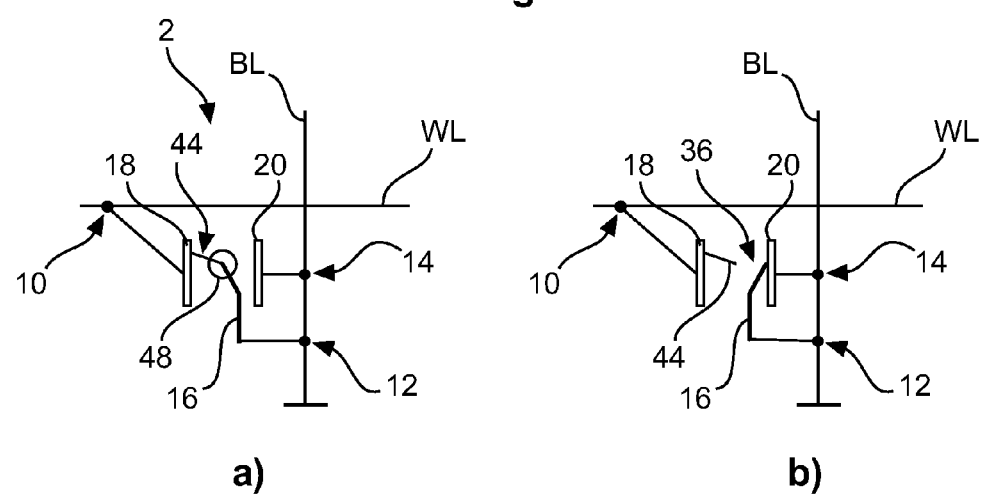
FIGS. 8a and 8b are simplified circuit diagrams of memory cells, according to further embodiments of the invention.

FIGS. 8a and 8b are simplified circuit diagrams illustrating a memory cell 2 corresponding to the embodiment of FIG. 7. FIG. 8a is the ON-status representing a logical "1", FIG. 8b is the OFF-status representing a logical "0". In the ON-state, the free end 36 of the nanotube 16 is connected to the second free end 46 of the second nanotube 44 in the transitional area 48. The memory cell 2 provides the full functionality of a switch (due to the tilting of the free end 36 of the first nanotube 16), a diode (due to the different structure of the first and second nanotube 16, 44 in the transitional area 48 or due to the different structure of the fixed portion 38 and the tilted portion 40 of the nanotube 16) and a protective resistor (due to the oxide layer 42 that is present on the surface of the storage electrode 18).

FIG. 8b illustrates the OFF-status (logical "0") of the memory cell 2. The free end 36 of the nanotube 16 is tilted towards the release electrode 20 and accordingly, there is no electrical contact between the bit line BL and the word line WL.

Although the invention has been described hereinabove with reference to a specific embodiment, it is not limited to this embodiment and no doubt further alternatives will occur to the skilled person that lie within the scope of the invention as claimed.

REFERENCE SIGNS 2 memory cell
4 MOS transistor
6 sense amplifier
8 nanotube element
10 storage node
12 reference node
14 release node
16 carbon nanotube
18 storage electrode 20 release electrode
21 . . . 26 memory cell
30 protective resistor
32 switch
34 diode
36 first free end
38 fixed portion
40 tilted portion
42 oxide layer
44 second carbon nanotube
46 second free end
48 transitional area
A longitudinal axis
BL bit line
RL release line
WL word line

The invention claimed is:

1. A programmable read only memory (PROM) device, having a storage electrode that is coupled to a word line, a reference node that is coupled to a bit line and a memory cell comprising a nanotube having a tilted portion which comprises a free end and a fixed portion which is coupled to the reference node, wherein the nanotube comprises a structural defect between the fixed portion and the tilted portion which causes the nanotube to bend towards either the storage electrode or an opposite release electrode such that the free end is electrically connected to either the storage electrode or the release electrode, the tilted portion and the fixed portion being configured to have a different electronic band-gap which are arranged so as to form a diode between the tilted portion and the fixed portion, an anode of the diode being coupled to the word line and a cathode of the diode being coupled to the bit line, and at least one of the storage electrode and the release electrode comprising a surface oxide layer.

2. The PROM-device according to claim 1, wherein the structural defect comprises at least one heptagon and at least one pentagon.

3. The PROM-device according to claim 1, wherein a second nanotube is coupled to the storage electrode and the free end of the first nanotube is electrically connected to the storage electrode via the second nanotube.

4. The PROM-device according to claim 2, wherein a second nanotube is coupled to the storage electrode and the free end of the first nanotube is electrically connected to the storage electrode via the second nanotube.

5. The PROM-device according to claim 3, wherein a first free end of the first nanotube faces a second free end of the second nanotube.

6. The PROM-device according to claim 3, wherein the tilted portion of the first nanotube has a different band-gap than the second nanotube.

7. The PROM-device according to claim 6, wherein the band-gap of the tilted portion of the first nanotube and the band-gap of the second nanotube are arranged so as to form a diode between a first free end of the first nanotube and a second free end of the second nanotube.

8. A method of operating a programmable read only memory (PROM) device having a storage electrode that is coupled to a word line and a reference node that is coupled to a bit line, wherein a memory cell comprises a nanotube having a tilted portion comprising a free end and a fixed portion which is coupled to the reference node, and wherein for writing bit information to the memory cell, the method comprises inducing a structural defect in the nanotube such that the free end of the nanotube is tilted towards either the storage electrode or an opposite release electrode so as to electrically connect the free end to either the storage or the release electrode.

9. The method according to claim 8, wherein inducing the structural defect is performed by ion implantation.

10. The method according to claim 8, further comprising curing the nanotube.

11. The method according to claim 8, wherein for reading bit information from the memory cell, the method comprises applying a high level to the word line, wherein the memory cell provides the high level to the bit line, wherein the fixed portion and the tilted portion have different electronic band-gaps, and wherein the different band-gaps form a diode that protects other memory cells from the high level.

12. The method according to claim 11, comprising utilizing the storage electrode and the opposite release electrode to provide a protective ohmic resistance.

13. The method according to claim 8, comprising utilizing the storage electrode and the opposite release electrode to provide a protective ohmic resistance.

14. The PROM-device according to claim 1, wherein the structural defect comprises at least one heptagon-pentagon pair.

* * * * *